(12) United States Patent
Oka et al.

(10) Patent No.: US 10,459,303 B2
(45) Date of Patent: Oct. 29, 2019

(54) DISPLAY DEVICE WITH CURVED PART

(71) Applicant: Japan Display Inc., Tokyo (JP)

(72) Inventors: Shinichiro Oka, Tokyo (JP); Shinichi Komura, Tokyo (JP); Yosuke Hyodo, Tokyo (JP); Lu Jin, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/693,960

(22) Filed: Sep. 1, 2017

(65) Prior Publication Data

US 2018/0088380 A1 Mar. 29, 2018

(30) Foreign Application Priority Data

Sep. 23, 2016 (JP) .................................. 2016-185185

(51) Int. Cl.
*G02F 1/1368* (2006.01)
*F21V 8/00* (2006.01)
(Continued)

(52) U.S. Cl.
CPC ........... *G02F 1/1368* (2013.01); *G02B 6/009* (2013.01); *G02B 6/0088* (2013.01);
(Continued)

(58) Field of Classification Search
CPC ............... G02F 1/1368; G02F 1/13452; G02F 1/133305; G02F 1/136286; G02F 2201/56;
(Continued)

(56) References Cited

U.S. PATENT DOCUMENTS

2006/0066788 A1 3/2006 Utsumi et al.
2008/0088759 A1 4/2008 Utsumi et al.
(Continued)

FOREIGN PATENT DOCUMENTS

JP 2000-275626 A 10/2000
JP 2006-091393 A 4/2006
(Continued)

OTHER PUBLICATIONS

Korean Final Rejection dated Feb. 1, 2019 for the corresponding Korean patent application No. 10-2017-0105963, with partial English translation.
(Continued)

*Primary Examiner* — Selim U Ahmed
(74) *Attorney, Agent, or Firm* — Michael Best & Friedrich LLP

(57) ABSTRACT

A thin display device with a less bezel portion is provided. The display device includes: a first substrate with flexibility, the first substrate having a display section including a first pixel; a second substrate with flexibility; and a sealant which bonds the first substrate and the second substrate together. A curved part is provided inside the sealant in a planar view. When a surface of the first substrate opposing the second substrate is taken as a front surface and a surface opposite to the front surface is taken as a back surface, the back surface inside the curved part and the back surface outside the curved part are overlapped each other in a planar view. The display section is provided in the curved part.

5 Claims, 17 Drawing Sheets

(51) Int. Cl.
  *G02F 1/1333* (2006.01)
  *G02F 1/1345* (2006.01)
  *G02F 1/1362* (2006.01)
  *H01L 27/12* (2006.01)

(52) U.S. Cl.
  CPC .... *G02F 1/13452* (2013.01); *G02F 1/133305* (2013.01); *G02F 1/136286* (2013.01); *G02F 1/136227* (2013.01); *G02F 2001/13685* (2013.01); *G02F 2201/56* (2013.01); *H01L 27/1218* (2013.01); *H01L 27/1255* (2013.01)

(58) Field of Classification Search
  CPC ..... G02F 2001/13685; G02F 1/136227; G02B 6/009; G02B 6/0088; H01L 27/1255
  See application file for complete search history.

(56) References Cited

U.S. PATENT DOCUMENTS

2011/0007042 A1\* 1/2011 Miyaguchi ........ G02F 1/133305 345/204
2011/0292313 A1\* 12/2011 Takenaka ............ G02F 1/13452 349/42
2015/0062525 A1 3/2015 Hirakata
2015/0212548 A1 7/2015 Namkung et al.
2016/0219732 A1\* 7/2016 Cho ........................ G09F 9/301
2016/0268524 A1\* 9/2016 Suzuki ................ H01L 51/0097

FOREIGN PATENT DOCUMENTS

| | | |
|---|---|---|
| JP | 2008-089966 A | 4/2008 |
| JP | 2012-220911 A | 11/2012 |
| JP | 2014-206760 A | 10/2014 |
| KR | 10-2015-0090743 A | 8/2015 |
| KR | 10-2016-0046874 A | 4/2016 |

OTHER PUBLICATIONS

Korean Office Action dated Oct. 22, 2018 for the corresponding Korean patent application No. 10-2017-0105963, with partial English translation.

\* cited by examiner

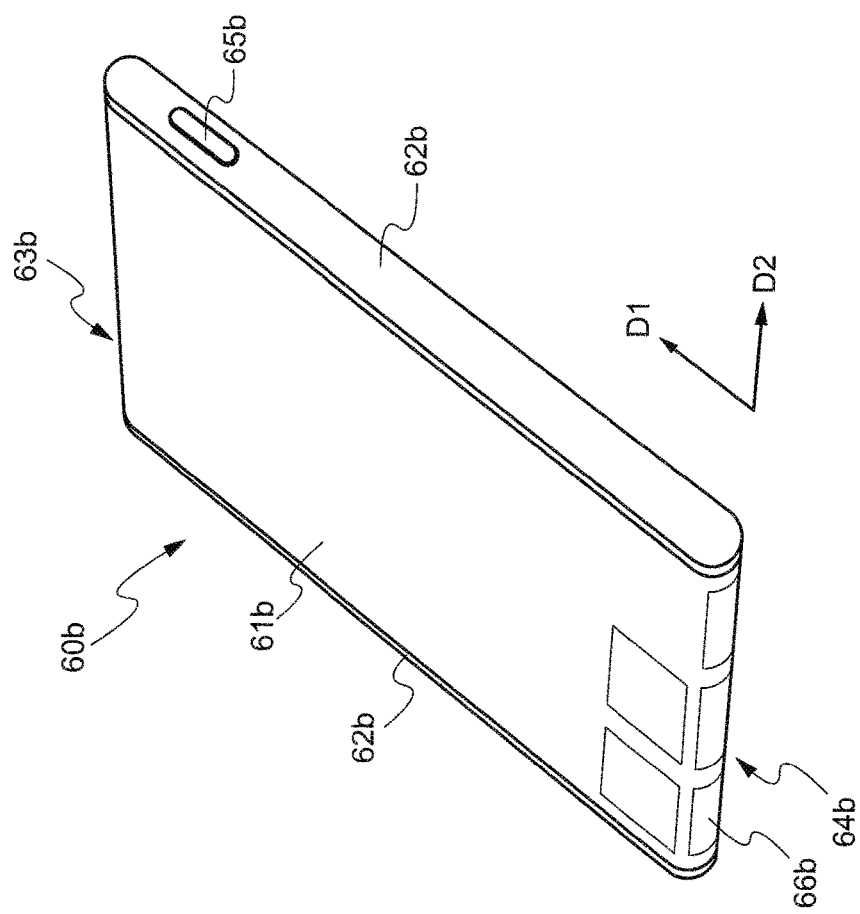

DISPLAY DEVICE WITH CURVED PART

CROSS REFERENCE TO RELATED APPLICATIONS

This application is based on and claims the benefit of priority from the prior Japanese Patent Application No. 2016-185185, filed on Sep. 23, 2016, the entire contents of which are incorporated herein by reference.

FIELD

The present invention relates to display devices including a plurality of pixels. In particular, the present invention relates to a display device using a flexible substrate as a support substrate.

BACKGROUND

Conventionally, a display device using a substrate with flexibility (hereinafter referred to as a "flexible substrate") as a support substrate of a display device has been known. The display device using the flexible substrate has pliability as a whole and can be bent, and thus has a merit of great versatility for use environments.

Also, when the flexible substrate is used, a bezel portion (an edge portion visually recognized by an observer other than a display screen) of the display device can be advantageously reduced. For example, Japanese Unexamined Patent Application Publication No. 2000-275626 discloses a display device having a seal member and an external input terminal provided at a bent portion of a flexible substrate. Japanese Unexamined Patent Application Publication No. 2014-206760 discloses a display device having a drive circuit part arranged on a back surface side of a display region by bending a substrate at a wiring portion connecting the display region and the drive circuit part.

SUMMARY

A display device in one embodiment of the present invention includes: a first substrate with flexibility, the first substrate having a display section including a first pixel; a second substrate with flexibility; and a sealant which bonds the first substrate and the second substrate together, wherein a curved part is provided inside the sealant in a planar view, when a surface of the first substrate opposing the second substrate is taken as a front surface and a surface opposite to the front surface is taken as a back surface, the back surface inside the curved part and the back surface outside the curved part are overlapped each other in a planar view, and the display section is provided in the curved part.

A display device in one embodiment of the present invention includes a first substrate with flexibility, the first substrate having a display section including a first pixel, a second substrate with flexibility, and a sealant which bonds the first substrate and the second substrate together, wherein the first substrate and the second substrate have a curved part so that the sealant and the display section are overlapped each other in a planar view.

A display device in one embodiment of the present invention includes: a first substrate with flexibility, the first substrate having a display section including a first pixel; a second substrate with flexibility; and a sealant which bonds the first substrate and the second substrate together, wherein a curved part is provided inside the sealant in a planar view, when a surface of the first substrate opposing the second substrate is taken as a front surface and a surface opposite to the front surface is taken as a back surface, the back surface inside the curved part and the back surface outside the curved part are overlapped each other in a planar view, and flexural rigidity of the curved part is lower than flexural rigidity of a portion inside the curved part.

A display device in one embodiment of the present invention includes: a first substrate with flexibility, the first substrate having a display section including a first pixel; a second substrate with flexibility; a sealant which bonds the first substrate and the second substrate together; and an optical member which is a polarizing member or a light-guiding member, wherein a curved part is provided inside the sealant in a planar view, when a surface of the first substrate opposing the second substrate is taken as a front surface and a surface opposite to the front surface is taken as a back surface, the back surface inside the curved part and the back surface outside the curved part are overlapped each other in a planar view, and the optical member and the display section are overlapped each other and an end of the optical member is inside the curved part in a planar view.

BRIEF DESCRIPTION OF DRAWINGS

FIG. 11B is a perspective view depicting an example of the schematic configuration of the electronic device having the display device of the sixth embodiment incorporated therein;

DESCRIPTION OF EMBODIMENTS

Figure 1:
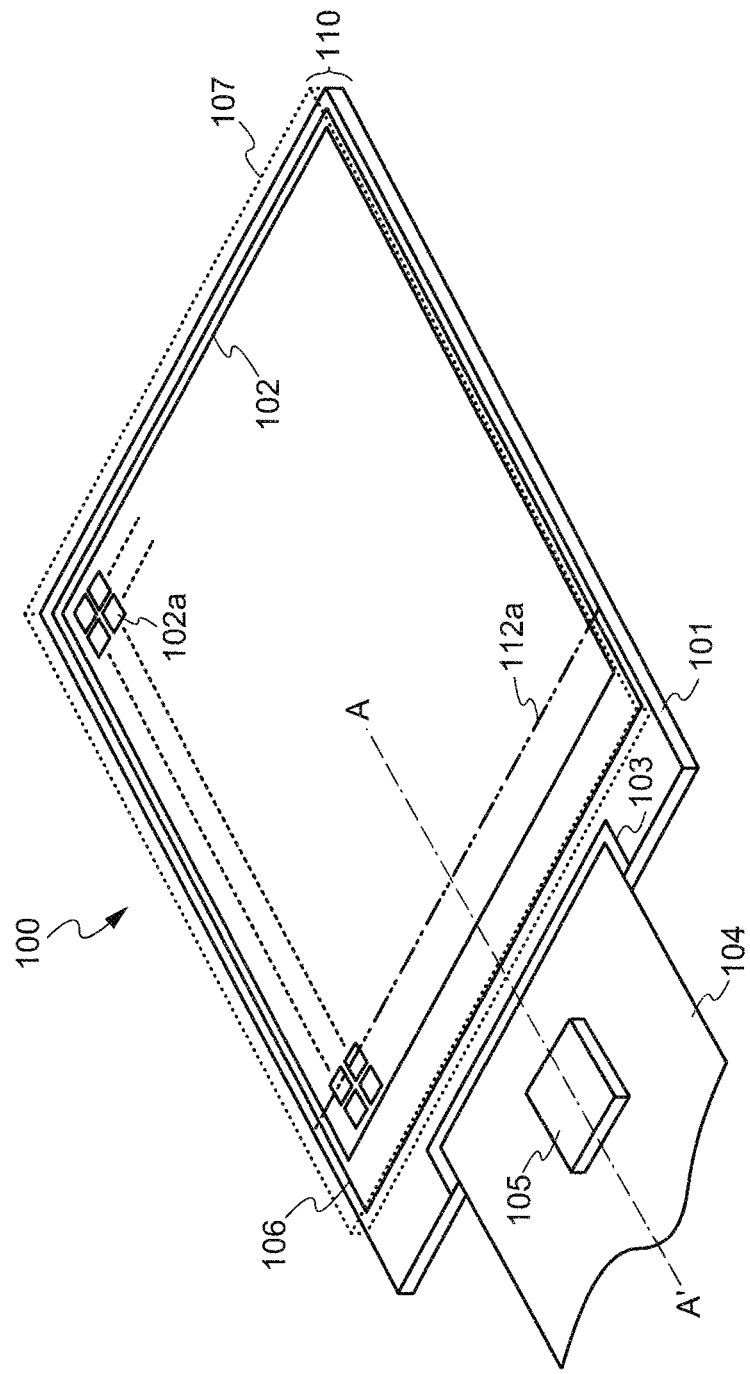
FIG. 1 is a perspective view depicting an example of a schematic configuration of a display device in a first embodiment.

In the display device described in Japanese Unexamined Patent Application Publication No. 2000-275626, the seal member and the external input terminal are required to be arranged at the bent portion, and thus the width of the bent part is required to be allocated enough for arrangement of the seal member and the external input terminal. Thus, there is a problem that the display device cannot be made thin. Moreover, with the external input terminal arranged at the bent portion, there is a possibility that the external input terminal is broken at the time of bending.

In the display device described in Japanese Unexamined Patent Application Publication No. 2014-206760, the substrate is bent between the display region and the drive circuit part, and thus a margin for bending is required to be allocated. Thus, there still is a room for improvement in reduction of the bezel portion of the display device.

Thus, an object of the present invention is to provide a thin display device with a less bezel portion.

In the following, each embodiment of the present invention is described with reference to the drawings and so forth. However, the present invention can be implemented in various modes in a range not deviating from the gist of the invention, and should not be construed as being limited to the description of the embodiments illustrated below. Also, regarding the drawings, for more clarification of description, the width, thickness, shape, and so forth of each part or unit may be schematically represented, compared with actual modes. However, these schematic drawings are depicted by way of example and do not limit the interpretation of the present invention. Furthermore, in the specification and each drawing, a component including a function similar to that of a component in a drawing already described is provided with a reference character identical to that of the already-described component, and redundant description may be omitted.

Note in the specification and claims that expressions such as "above" and "below" for description of the drawings represent relative positional relations between a target structure and another structure. Specifically, when viewed from a side surface, a direction from a first substrate (array substrate) toward a second substrate (counter substrate) is defined as "above", and a direction opposite thereto is defined as "below".

Also, "inside" and "outside" represent relative positional relations of two areas with reference to a display section. That is, "inside" indicates a side relatively near the display section with respect to one area, and "outside" indicates a side relatively far from the display section with respect to one area. However, the definitions of "inside" and "outside" herein are assumed to be in a state in which the display device is not bent.

Also in the specification, expressions such as "a includes A, B, or C", "a includes any of A, B, and C", and "a includes one selected from a group comprising A, B, and C" do not preclude a case in which a includes a plurality of combinations of A to C unless otherwise specified. Furthermore, these expressions do not preclude a case in which a includes another component.

A "display device" refers to a structure which displays video using an electrooptic layer. For example, the term "display device" may indicate a display cell including an electrooptic layer or may indicate a structure having another optical member (for example, a polarizing member, backlight, cover member, touch panel, or the like) attached to a display cell. Here, the "electrooptic layer" can include a liquid-crystal layer, electroluminescence (EL) layer, electrochromic (EC) layer, or electrophoretic layer unless a technical contradiction arises. Therefore, while a liquid-crystal display device including a liquid-crystal layer is illustrated and described as a display device in the embodiments described below, this is not meant to preclude application to a display device including any of the other electrooptic layers described above.

First Embodiment

<Structure of Display Device>

First, a schematic configuration of a liquid-crystal display device as an example of a display device 100 of a first embodiment is described. FIG. 1 is a perspective view of a schematic configuration of the display device 100 in the first embodiment.

The display device 100 has an array substrate 101, a display section 102, a terminal unit 103, a flexible printed circuit board 104, a drive circuit 105, a sealant 106, and a counter substrate 107. For simplification of description, optical members such as a polarizing member and a backlight are omitted in FIG. 1. These optical members will be described further below.

The array substrate 101 is a substrate having a thin-film transistor and a plurality of pixels 102a including pixel electrodes connected to the thin-film transistor provided on a substrate with flexibility (for example, a resin substrate). The display section 102 is a region configured with the plurality of pixels 102a arrayed in a row direction and a column direction.

Each pixel 102a includes a circuit using a thin-film transistor as a switching element. By controlling ON/OFF operation of the switching element in response to a supplied video signal, each pixel 102a performs orientation control over liquid-crystal molecules corresponding to a pixel electrode included in the pixel 102a. That is, the above-described display section 102 refers to a region including the thin-film transistor and a pixel to which a video signal is supplied via the thin-film transistor (the pixel may be hereinafter referred to as a "first pixel").

Figure 2:
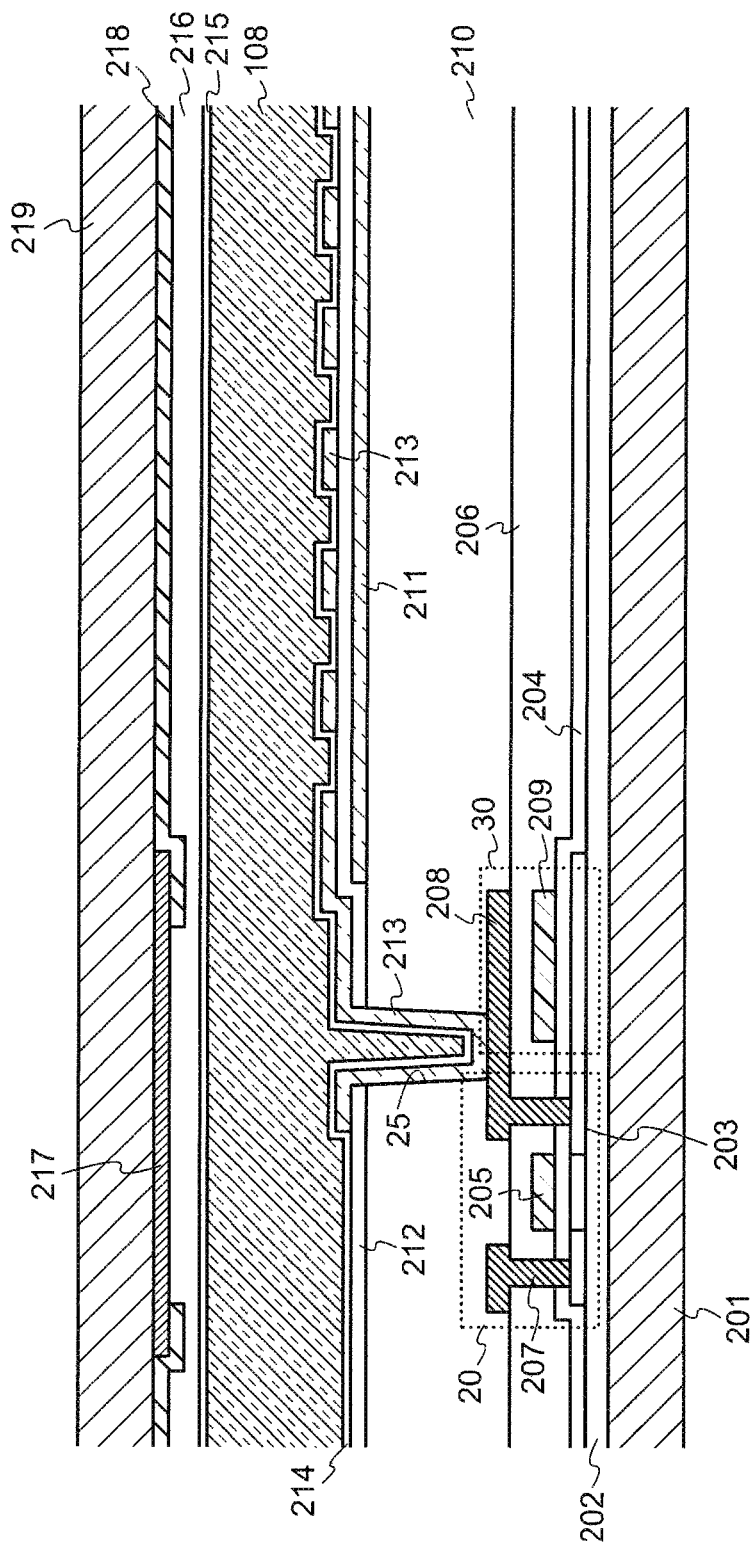
FIG. 2 is a sectional view depicting an example of the configuration of a pixel structure of the display device in the first embodiment.

Here, the pixel 102a as a first pixel is briefly described. FIG. 2 is a sectional view depicting the configuration of a pixel structure of the display device 100 in the first embodiment.

In FIG. 2, on a front surface of the resin substrate configured of a resin material such as polyimide, an undercoat layer 202 configured of an inorganic insulating material is provided. Above the undercoat layer 202, a thin-film transistor 20 and a retention capacitor 30 are provided.

The thin-film transistor 20 includes a semiconductor layer 203, a gate insulating layer 204, a gate electrode 205, an insulating layer 206, a source electrode 207, and a drain electrode 208. These components can be configured of known materials.

The retention capacitor 30 includes the semiconductor layer 203, the gate insulating layer 204, a capacitive electrode 209, the insulating layer 206, and the drain electrode 208. Here, the semiconductor layer 203, the gate insulating layer 204, and the capacitive electrode 209 configure a first retention capacitor, and the capacitive electrode 209, the insulating layer 206, and the drain electrode 208 configure a second retention capacitor. The retention capacitor 30 has a total capacitance of these first retention capacitor and second retention capacitor.

Above the thin-film transistor 20 and the retention capacitor 30, a resin layer 210 configured of a resin material such as acrylic is provided, planarizing undulations due to the thin-film transistor 20 and the retention capacitor 30. Above the resin layer 210, a common electrode 211 configured of a transparent conductive film made of ITO (Indium Tin Oxide) or the like is provided. Above the common electrode 211, a pixel electrode 213 is provided via an insulating layer 212.

As the insulating layer 212, an inorganic insulating film such as, for example, a silicon oxide film or silicon nitride film can be used, although not limited thereto. Also, as with the common electrode 211, the pixel electrode 213 is configured of a transparent conductive film made of ITO or the like. The pixel electrode 213 is electrically connected to the drain electrode 208 via a contact hole 25 provided in the resin layer 210 and the insulating layer 212. While it seems that a plurality of pixel electrodes 213 are provided in FIG. 2, the pixel electrode 213 in a planar view has, in practice, a comb-like pattern shape. That is, the pixel electrode 213 in a planar view has a shape with a plurality of adjacently-arranged linear electrodes connected at one end.

In the present embodiment, an electric field (horizontal electric field) is formed between the common electrode 211 and the pixel electrode 213. A display device using a horizontal electric field as described above is referred to as a display device in IPS (In-Plain Switching) mode. Also in the IPS mode, as in the present embodiment, a mode using a horizontal electric field when the common electrode 211 and the pixel electrode 213 are arranged so as to overlap (in this case, the horizontal electric field is referred to as a fringe electric field) is referred to as FFS (Fringe Field Switching) mode.

However, any other liquid-crystal display mode may be used. For example, a mode using a horizontal electric field formed by using a pixel electrode and a common electrode provided in the same layer may be used. Also, VA (Vertical Alignment) mode may be used, in which a vertical electric field is formed between a pixel electrode provided on an array substrate side and a common electrode provided on a counter electrode side to control liquid-crystal orientation in that vertical electric field.

Above the pixel electrode 213, an alignment film 214 is provided. In the present embodiment, components from the resin substrate 201 to the alignment film 214 are collectively referred to as the array substrate 101. To the pixel electrode 213, a video signal is supplied via the thin-film transistor 20. The video signal is supplied to the source electrode 207 of the thin-film transistor 20, and is transmitted to the drain electrode 208 by the control of the gate electrode 205. As a result, the video signal is supplied from the drain electrode 208 to the pixel electrode 213.

Above the alignment film 214, a liquid-crystal layer 108 is retained. As described above, the liquid-crystal layer 108 is retained by being surrounded by a sealant 106 between the array substrate 101 and the counter substrate 107.

Above the liquid-crystal layer 108, an alignment film 215 on a counter substrate 107 side is provided. Above the alignment film 215, an overcoat layer 216 is provided. The overcoat layer 216 planarizes undulations due to a light-shielding member 217 configured of a resin material containing a black pigment or black metal material and a color filter member 218 configured of a resin material containing a pigment or dye corresponding to each color of RGB.

Above the light-shielding member 217 and the color filter member 218, a resin substrate 219 configured of a resin material such as polyimide is arranged. In practice, the light-shielding member 217, the color filter member 218, the overcoat layer 216, and the alignment film 215 are laminated above one surface of the resin substrate 219 to configure the counter substrate 107. For improvement in resistance to water, an inorganic insulating film made of silicon nitride, silicon oxide, or the like may be formed between the resin substrate 219 and the color filter member 218.

As described above, the display section 102 of the present embodiment has the plurality of pixels 102a having the structure described by using FIG. 2.

With reference to FIG. 1 again, the terminal unit 103 is a terminal which supplies an external video signal or the like to the display section 102. Specifically, the terminal unit 103 is configured with wirings connected to the respective pixels 102a integrated together.

The flexible printed circuit board 104 is electrically connected to the terminal unit 103 to supply an external video signal, drive signal, and so forth. The flexible printed circuit board 104 is configured with a plurality of wirings arranged on a resin film, and is bonded to the terminal unit 103 via an anisotropic conductive film or the like. The flexible printed circuit board 104 is provided with the drive circuit 105 configured of an IC chip.

The drive circuit 105 supplies the display section 102 with a video signal to be supplied to the pixel electrode of each pixel 102a and a drive signal for controlling the thin-film transistor of each pixel 102a. In FIG. 1, an example is depicted in which the drive circuit 105 configured of an IC chip for controlling the thin-film transistor configuring each pixel 102a is provided to the flexible printed circuit board 104. However, a drive circuit such as a gate driver circuit or a source driver circuit can be provided around the display section 102 by using a thin-film transistor. Also, the drive circuit 105 configured of an IC chip can be provided on the array substrate 101 outside the sealant 106 in COG (Chip On Glass) mode.

The sealant 106 bonds the array substrate 101 and the counter substrate 107 together, and retains the liquid-crystal layer 108 (refer to FIG. 2) between the array substrate 101 and the counter substrate 107. For simplification of the drawing, the counter substrate 107 is indicated by dotted lines in FIG. 1. Also, although not depicted in FIG. 1, the counter substrate 107 includes a light-shielding member and a color filter member. A structure including the array substrate 101, the sealant 106, the counter substrate 107, and the liquid-crystal layer 108 is hereinafter referred to as a liquid-crystal cell 110.

In FIG. 1, a two-dot-chain line 112a depicted inside the sealant 106 indicates a position where the display device 100 is bent, as will be described further below. In this manner, the bending position of the liquid-crystal cell 110 indicated by the two-dot-chain line 112a is inside the sealant 106. The reason why the bending position is set inside the display section 102 in the present embodiment will be described further below.

Figure 3:
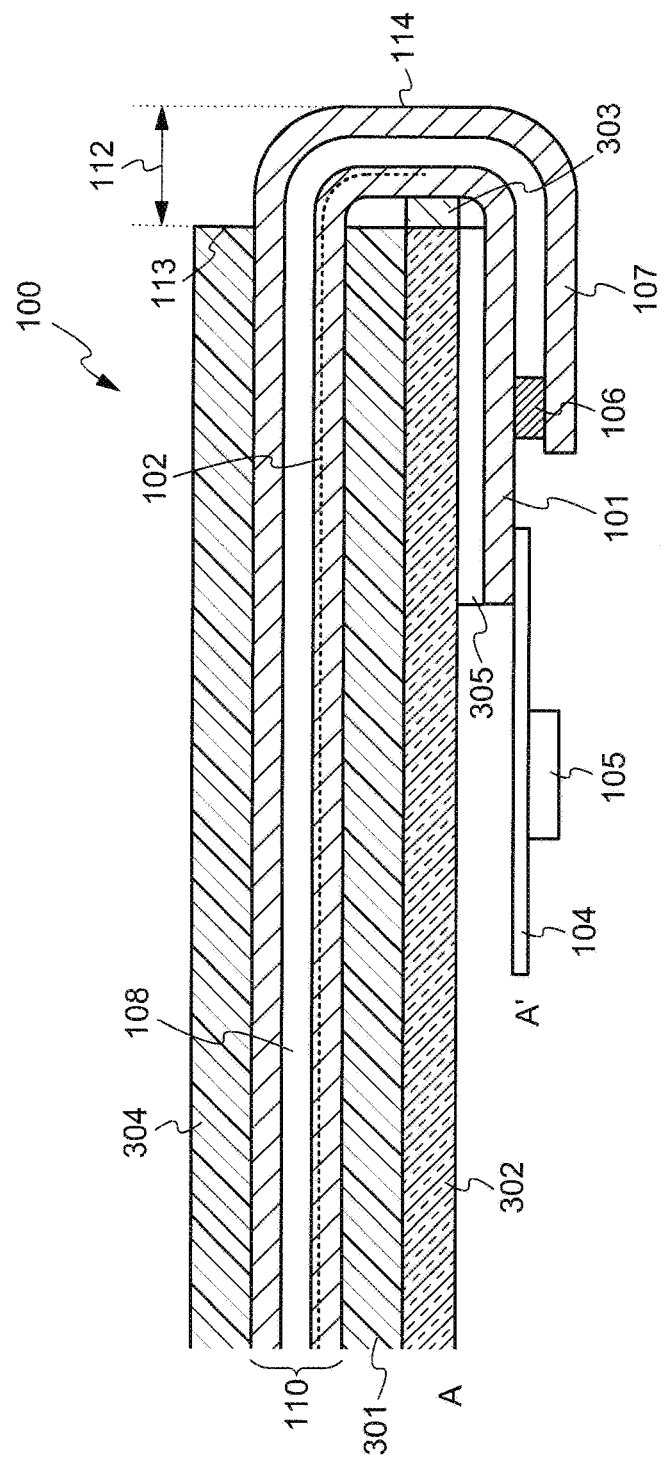
FIG. 3 is a sectional view depicting the example of the schematic configuration of the display device in the first embodiment.

FIG. 3 is a diagram depicting a sectional configuration of the display device 100 of the first embodiment. Specifically, FIG. 3 depicts a state of the display device 100 depicted in FIG. 1 as being cut along a one-dot-chain line A-A' and partially bent.

In FIG. 3, of two surfaces of the array substrate 101, a surface opposing (facing) the counter substrate 107 is defined as a front surface, and a surface opposite to the front surface is defined as a back surface. Similarly, of two surfaces of the counter substrate 107, a surface opposing (facing) the array substrate 101 is defined as a front surface, and a surface opposite to the front surface is defined as a back surface. Therefore, the liquid-crystal layer 108 is retained as interposed between the front surface of the array substrate 101 and the front surface of the counter substrate 107 inside the sealant 106.

In the display device 100 of the present embodiment, a polarizing member 301, a light-guiding member 302, and a light source 303 are arranged on the back surface side of the array substrate 101 so as to be overlapped on the display section 102. Here, the polarizing member 301 and the light-guiding member 302 are configured as interposed on the back surface side of the array substrate 101. Specifically, the polarizing member 301 and the light-guiding member 302 are interposed between a portion of the back surface of the array substrate 101 inside a curved part 112, which will be described further below, and a portion thereof outside the curved part 112. Also, the light source 303 is arranged on a side surface of the light-guiding member 302 so as to oppose the curved part 112, which will be described further below. These light-guiding member 302 and light source 303 configure an illuminating device (backlight).

On the back surface side of the counter substrate 107, the polarizing member 304 is arranged. With this, light emitted from the light source 303 is guided by the light-guiding member 302 to the polarizing member 301, and is recognized by an observer via the liquid-crystal cell 110 and the polarizing member 304. In the specification and claims, an optically acting member such as a polarizing member, a light-guiding member, or a light source may be referred to as an "optical member".

Here, the example is described in which a polarizing member and an illuminating device are provided as members other than the liquid-crystal cell 10. In another example, another optical member (such as a retardation plate or antireflection plate) or a touch panel may further be provided. For these optical member and touch panel, a known member or a known structure can be used.

Meanwhile, in the display device 100 of the present embodiment, a substrate with flexibility (for example, a resin substrate) is used as a support substrate of the array substrate 101. Thus, the array substrate 101 has flexibility as a whole. Similarly, a substrate with flexibility is used as a support substrate of the counter substrate 107, and thus the counter substrate 107 also has flexibility as a whole. Therefore, the display device 100 of the present embodiment can be bent so that the flexible printed circuit board 104 is arranged on the back surface side of the liquid-crystal cell 110, as depicted in FIG. 3.

Here, in the display device 100 of the present embodiment, a portion bent as being folded is referred to as a "curved part". As depicted in FIG. 3, the display device 100 has the curved part 112 inside the sealant 106 in a planar view. Also in a planar view, the display device 100 is bent so that the portion of the back surface of the array substrate 101 inside the curved part 112 and the portion thereof outside the curved part 112 are overlapped each other.

Here, the liquid-crystal cell 110 is bent inside the sealant 106. Specifically, the liquid-crystal cell 110 is bent along the two-dot-chain line 112a depicted in FIG. 1, and thus the sealant 106 is partially positioned on the back surface side of the display device 100. That is, in the display device 100, the sealant 106 partially opposes the back surface of the array substrate 101. In other words, in a planar view, the array substrate 101 and the counter substrate 107 have the curved part 112 so that the sealant 106 and the display section 102 are overlapped each other. Thus, in a sectional view, the light-guiding member 302 is positioned between the sealant 106 and the display section 102.

In the present embodiment, an insulating layer 305 is provided as a cushioning member in order to avoid a contact between the back surface of the array substrate 101 and the light-guiding member 302. As the insulating layer 305, for example, a resin layer can be used. As a matter of course, the insulating layer 305 can be omitted. Also, when the drive circuit 105 is provided on the array substrate 101 in COG mode, the configuration may be such that the drive circuit 105 is covered with the insulating layer 305 for protection.

Also in the present embodiment, the configuration is such that a portion of the liquid-crystal cell 110 not overlapped on the polarizing member 301 and the polarizing member 304 is bent. Thus, as depicted in FIG. 3, the curved part 112 in the display device 100 of the present embodiment slightly projects from an edge 113 of the polarizing member 304 in a planar view. Here, in a planar view, an end of the curved part 112 visually recognizable by the observer is defined as a "virtual end". That is, the curved part 112 can also be said as indicating a portion positioned in a range from the edge 113 of the polarizing member 304 to a virtual end 114.

In the present embodiment, as the polarizing member 301 and the polarizing member 304, a member harder than the substrates with flexibility configuring the array substrate 101 and the counter substrate 107 is used. Thus, the polarizing member 301 and the polarizing member 304 cannot be bent so as to be sufficiently folded, and an end of the optical member (for example, the edge 113 of the polarizing member 304) is inside the curved part 112. In a planar view, the end of the optical member is regarded as inside the curved part even if the end of the optical member is slightly overlapped on the curved part.

The display device 100 of the present embodiment thus has a structure in which flexural rigidity of the curved part 112 is lower than flexural rigidity of a portion inside the curved part 112 (that is, a portion where the polarizing member 301 and the polarizing member 304 are arranged). Here, "flexural rigidity" refers to a degree of difficulty in dimensional change (deformation) with respect to a bending force.

Meanwhile, in the display device 100 depicted in FIG. 3, a region where the observer can visually recognize video (a displayable region) can be substantially regarded as a region where the polarizing member 304 is arranged. Therefore, by fully utilizing the region where the polarizing member 304 is arranged, the displayable region can be increased to maximum.

Thus, as depicted in FIG. 3, in the display device 100 of the present embodiment, the display section 102 is provided not only in the region overlapped on the polarizing member 304 but also in the curved part 112. This allows the polarizing member 304 and the display section 102 to be appropriately overlapped to be extended to the edge 113 even if a laminating position of the polarizing member 301 and the polarizing member 304 is shifted or the bending position of the liquid-crystal cell 110 is shifted.

In the present embodiment, the display section 102 is provided midway through the curved part 112, and is not provided thereafter. That is, the above-described first pixel is not provided to a part of the curved part 112 or a portion inside the sealant 106 and outside the curved part 112. This is because the curved part 112 in the display device 100 of the present embodiment is basically not a displayable region.

However, the light-shielding member 217 or the color filter member 218 depicted in FIG. 2 may be overlapped not only on the display section 102 but also on the display section 102 and the curved part 112. This is because the light-shielding member 217 or the color filter member 218 provided to the curved part 112 can have a role of reinforcing the curved part 112.

Also in the display device 100 of the present embodiment, not a spherical spacer but a columnar spacer configured of a resin material is desirably used. In the present embodiment, a spacer is arranged also to the curved part 112 to maintain a cell gap of the curved part 112. Here, it is difficult for a spherical spacer to control the position of the spacer, and the position of the spacer in the curved part 112 may be fluctuated. By contrast, a columnar spacer is formed on the array substrate 101 by using photolithography, and thus can be advantageously arranged appropriately at a position as designed.

As described above, in the configuration of the display device 100 of the present embodiment, the liquid-crystal cell 110 is bent along a portion inside the sealant 106, thereby allowing full and effective utilization to the end (edge) of the display device 100 as a displayable region. Also, a substrate with flexibility is used as a support substrate, thereby allowing the liquid-crystal cell 110 to be bent so as to be folded.

Therefore, according to the present embodiment, a thin display device with a less bezel portion can be provided.

Second Embodiment

In the first embodiment, the example is described in which nothing is provided in a region inside the sealant 106 and outside the curved part 112. In this region, however, another component different from the first pixel may be provided. In a second embodiment, an example is described in which a dummy pixel is provided in a region inside the sealant 106 and outside the curved part 112. In the present embodiment, description is made by focusing on a difference in configuration from the display device 100 of the first embodiment, and the same structure is provided with the same reference character and may not be described.

Figure 4:
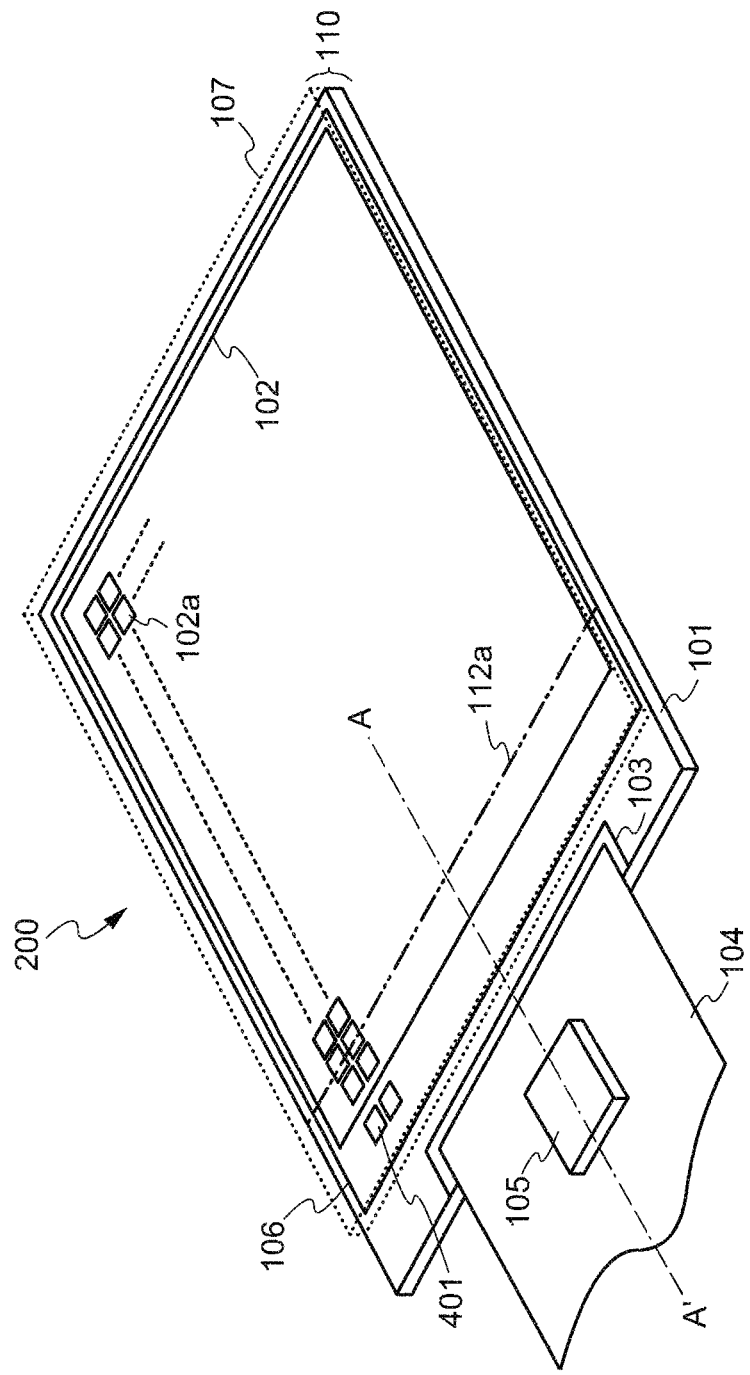
FIG. 4 is a perspective view depicting an example of a schematic configuration of a display device in a second embodiment.
Figure 5:
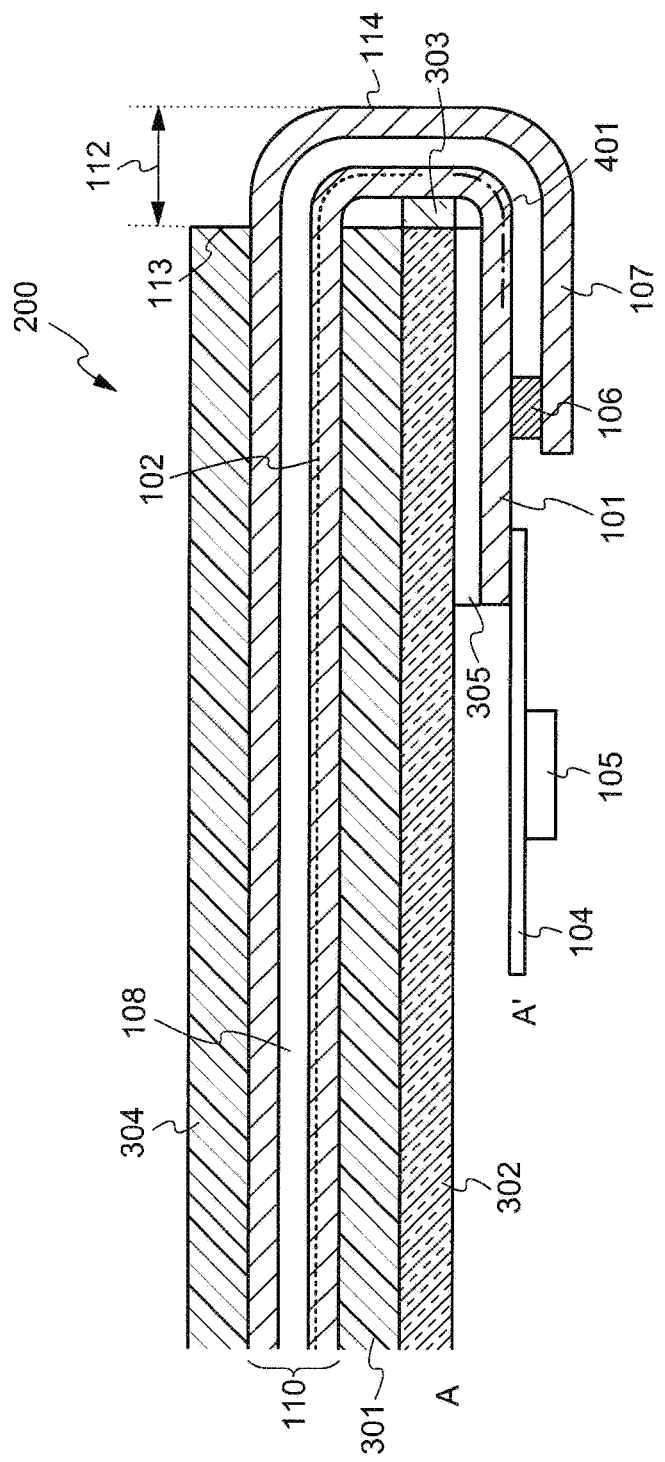
FIG. 5 is a sectional view depicting the example of the schematic configuration of the display device in the second embodiment.

FIG. 4 is a perspective view depicting a schematic configuration of a display device 200 in the second embodiment. FIG. 5 is a diagram depicting a sectional configuration of the display device 200 in the second embodiment. Specifically, FIG. 5 depicts a state of the display device 200 depicted in FIG. 4 as being cut along a one-dot-chain line A-A' and partially bent.

In the display device 200, a dummy pixel 401 is arranged outside the display section 102 configured of the first pixels (pixels 102a). That is, as depicted in FIG. 4 and FIG. 5, the dummy pixel 401 is arranged inside the sealant 106 and at a part of the curved part 112 or outside the curved part 112 (inside the sealant 106 and outside the bending position indicated by the two-dot-chain line 112a). A plurality of dummy pixels 401 may be provided.

The dummy pixel 401 is a pixel not contributory to video display. That is, the dummy pixel 401 included in the display device 200 of the present embodiment can also be said as a pixel to which a video signal is not supplied (this pixel may be hereinafter referred to as a "second pixel" so as to be distinguished from the "first pixel").

In the present embodiment, by arranging the dummy pixel 401 in a part of the curved part 112, a height alignment can be made with the portion where the display section 102 is provided (that is, the portion where the pixels 102a are provided). As a result, in the curved part 112, the thickness of the liquid-crystal cell 110 (cell gap) can be prevented from being significantly changed.

Third Embodiment

In a third embodiment, an example is described in which a polarizing member that can be formed by coating (hereinafter referred to as a "coating-type polarizing member") is used as a member configuring the polarizing member 301 in the display device 100 of the first embodiment. In the present embodiment, description is made by focusing on a difference in configuration from the display device 100 of the first embodiment, and the same structure is provided with the same reference character and may not be described.

Figure 6:
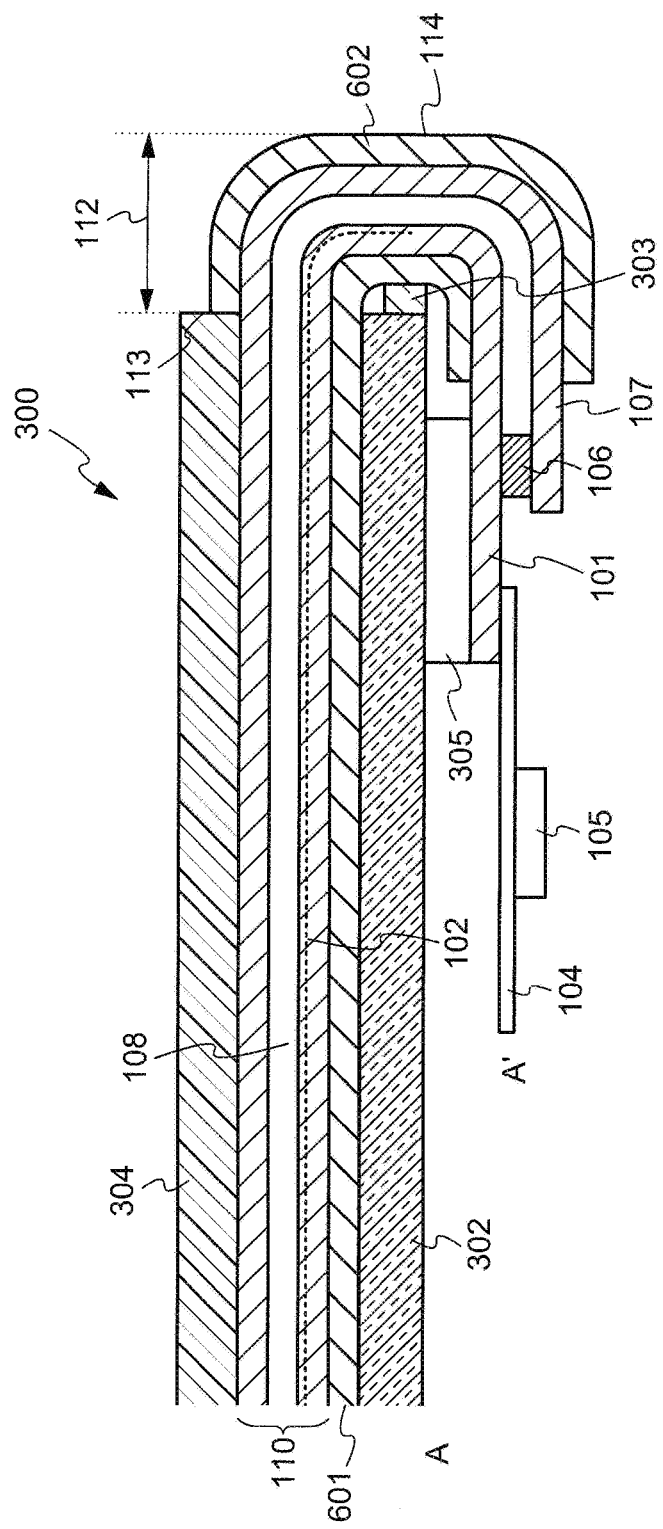
FIG. 6 is a sectional view depicting an example of a schematic configuration of a display device in a third embodiment.

FIG. 6 is a diagram depicting a sectional configuration of a display device 300 in the third embodiment. In the present embodiment, a coating-type polarizing member 601 is provided as a polarizing member arranged on the back surface side of the array substrate 101. Also, on the back surface side of the counter substrate 107, a coating-type polarizing member 602 is provided as a polarizing member, in addition to the polarizing member 304. The coating-type polarizing member 602 is arranged on the back surface side of the counter substrate 107 in the curved part 112. The coating-type polarizing member 601 and the coating-type polarizing member 602 both have flexibility.

Also, as a method of forming the coating-type polarizing members 601 and 602, a known technique can be used. For example, Direct Blue 202, Direct Orange 39, and Direct Red 81 are mixed at a ratio of 7:1:2 into a photosensitive resin containing an epoxy acrylate derivative with a fluorene skeleton and used for coating the back surface of the array substrate 101 or the back surface of the counter substrate 107, and then photolithography is used to form the coating-type polarizing members 601 and 602. Also, for example, a coating-type polarizing member described in Japanese Unexamined Patent Application Publication No. 2006-91393 or 2008-89966 can be used.

The coating-type polarizing members 601 and 602 of the present embodiment have pliability higher than that of the polarizing members 301 and 304 included in the display device 100 of the first embodiment. That is, flexural rigidity of the coating-type polarizing members 601 and 602 are lower than flexural rigidity of the polarizing members 301 and 304 of the first embodiment. Therefore, as depicted in FIG. 6, the coating-type polarizing members 601 and 602 can be bent even at the curved part 112 together with the array substrate 101.

As described above, in the display device 300 of the present embodiment, the coating-type polarizing member 601 is overlapped on the display section 102 and the curved part 112. The polarizing member 304 is overlapped on the display section 102. The coating-type polarizing member 602 is overlapped on the display section 102 and the curved part 112.

In the present embodiment, the example is described in which the polarizing member 301 of the first embodiment is changed to the coating-type polarizing member 601 and the coating-type polarizing member 602 is added to the back surface side of the counter substrate 107 at the curved part 112. However, the present embodiment is not limited to this. In FIG. 6, the polarizing member 304 can also be changed to a coating-type polarizing member. In this case, the polarizing members for use all have flexibility, and thus the curved part 112 can also be effectively utilized as a display screen.

Also, the polarizing members 301 and 304 of the first embodiment may be polarizing members with a thickness reduced to the extent of having flexibility. For example, by setting a thickness equal to or smaller than 70 μm (preferably equal to or smaller than 60 μm and, more preferably, equal to or smaller than 50 μm), the polarizing members 301 and 304 can have flexibility so as to be at least capable of being bowed. If the polarizing members with this flexibility (hereinafter referred to as "flexible polarizing members") are arranged in a range of the curved part 112 at least visually recognizable by the observer, the curved part 112 can be effectively utilized as a display screen.

Fourth Embodiment

In a fourth embodiment, an example is described in which a function of removing impurity ions of the liquid-crystal layer 108 is provided near the curved part 112 in the display device 100 of the first embodiment. In the present embodiment, description is made by focusing on a difference in configuration from the display device 100 of the first embodiment, and the same structure is provided with the same reference character and may not be described.

Figure 7:
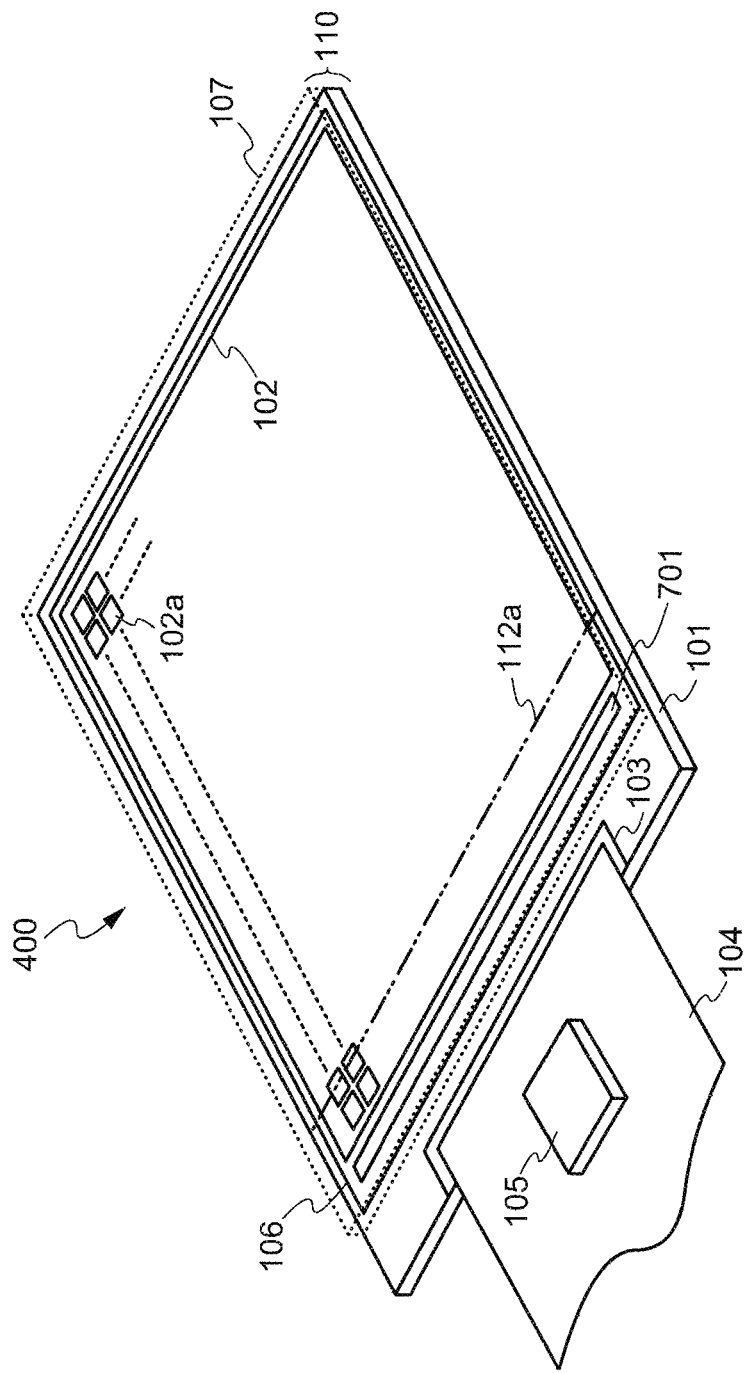
FIG. 7 is a perspective view depicting an example of a schematic configuration of a display device in a fourth embodiment.
Figure 8:
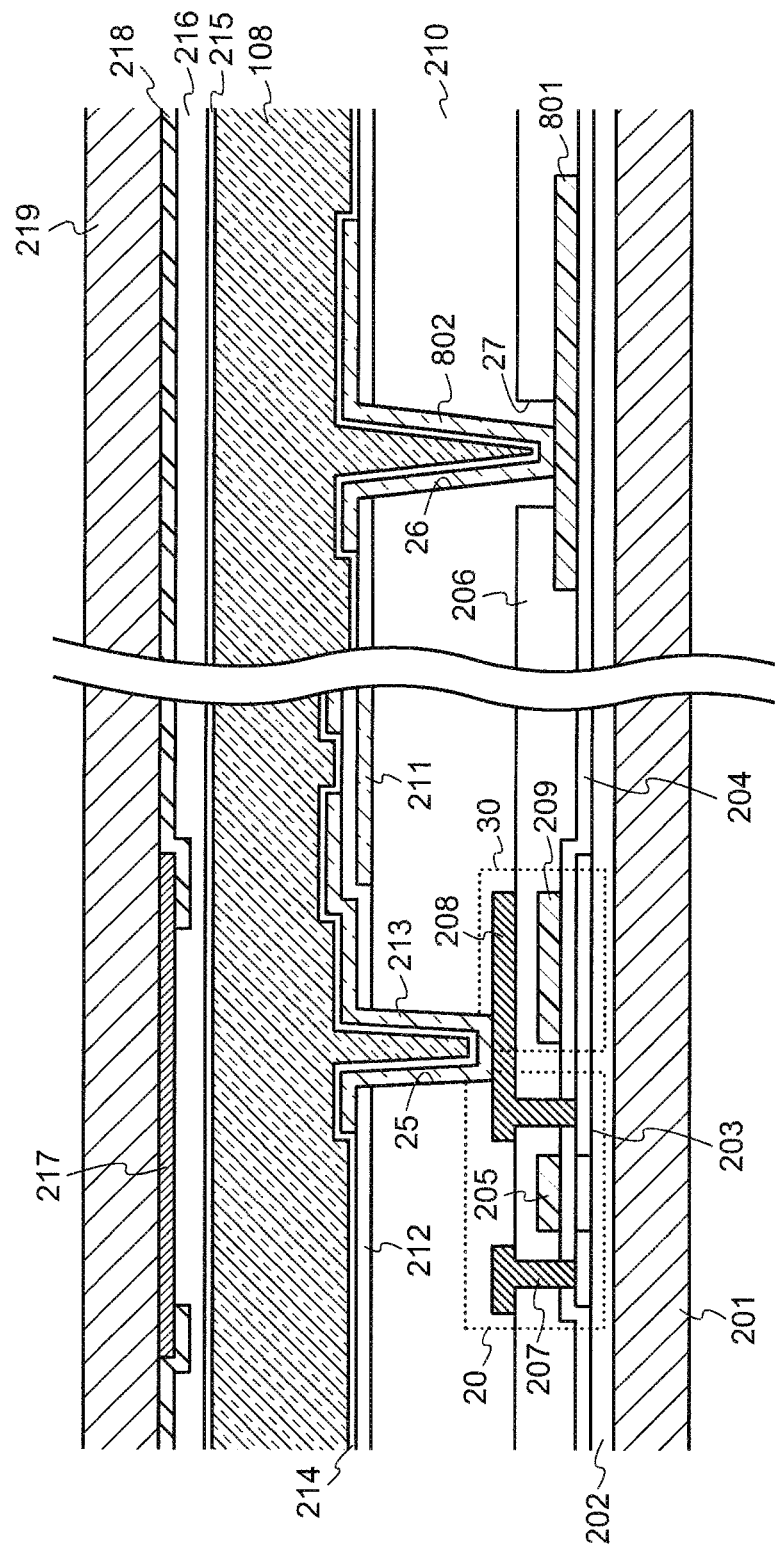
FIG. 8 is a sectional view depicting the example of the schematic configuration of the display device in the fourth embodiment.

FIG. 7 is a perspective view depicting a schematic configuration of a display device 400 in the fourth embodiment. FIG. 8 is a sectional view depicting the configuration of a pixel structure of the display device 400 in the fourth embodiment.

As depicted in FIG. 7, the display device 400 of the present embodiment has an ion trap unit 701 outside the display section 102. The ion trap unit 701 is a portion having a function of catching ions (for example, charged impurities such as ionic impurities) included in the liquid-crystal layer 108. Thus, the ion trap unit 701 is arranged near the liquid-crystal layer 108.

In the present embodiment, the ion trap unit 701 is arranged outside the display section 102 so as not to interfere with video display. Specifically, the ion trap unit 701 is preferably arranged inside the curved part 112 or the sealant 106 and outside the curved part 112 depicted in FIG. 3. As a matter of course, the ion trap unit 701 may be arranged inside the display section 102 and, for example, can be arranged below the light-shielding member 217 (refer to FIG. 2) in the display section 102.

Here, a specific configuration of the ion trap unit 701 is described using FIG. 8. The ion trap unit 701 can be formed in the course of manufacturing the display device 400.

In the present embodiment, a wiring 801 is formed in the course of forming the gate electrode 205 on the gate insulating layer 204. The wiring 801 is a wiring for transmitting a signal to be supplied to a trap electrode 802. That is, electrically connected to the wiring 801, the trap electrode 802 can retain a predetermined voltage. The trap electrode 802 can be formed simultaneously with the pixel electrode 213, and is connected to the wiring 801 via a contact hole 26 formed in the resin layer 210 and a contact hole 27 formed in the insulating layer 206.

Here, in the display section 102, orientation control over the liquid-crystal layer 108 is performed by a fringe electric field (horizontal electric field) formed between the pixel electrode 213 and the common electrode 211. On the other hand, in the ion trap unit 701, ions contained in the liquid-crystal layer 108 are caught depending on a potential (for example, a negative potential) supplied to the trap electrode 802. Thus, the display device 400 of the present embodiment has a function of catching ionic impurities and so forth in the liquid-crystal layer 108 depending on the potential supplied to the ion trap unit 701.

In the display device 400 of the present embodiment, the ion trap unit 701 is arranged inside the curved part 112 or inside the sealant 106 and outside the curved part 112, and is thus not influenced by video display on the display section 102. That is, according to the present embodiment, while the display section 102 is fully utilized as a displayable region, the ion trap unit 701 can be arranged in a region that cannot be seen from the observer.

While the ion trap unit 701 is basically arranged in a region where the observer cannot recognize video in the present embodiment, the ion trap unit 701 can be provided inside the display section 102. In this case, in a planar view, the light-shielding member 217 is arranged so as to be overlapped on the trap electrode 802. Also, as depicted in FIG. 8, by setting the width of the wiring 801 larger than the width of the trap electrode 802, the wiring 801 may be configured so as to function as a light-shielding member.

Furthermore, when applied to the display device 200 of the second embodiment, the ion trap unit 701 can also be configured by using an electrode included in the dummy pixel 401 depicted in FIG. 4.

Fifth Embodiment

In a fifth embodiment, an example is described in which an insulating layer is provided on the back surface of the counter substrate 107 in the curved part 112 in the display device 100 of the first embodiment. In the present embodiment, description is made by focusing on a difference in configuration from the display device 100 of the first embodiment, and the same structure is provided with the same reference character and may not be described.

Figure 9:
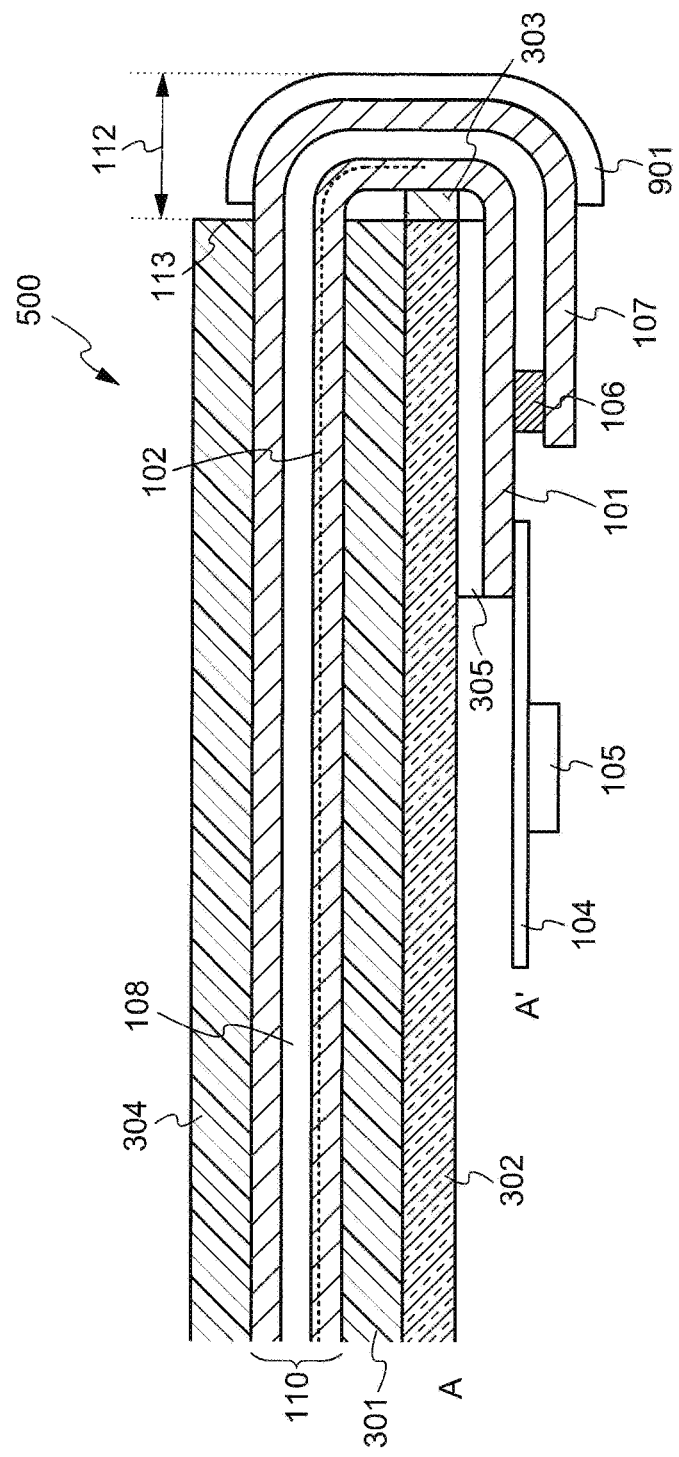
FIG. 9 is a sectional view depicting an example of a schematic configuration of a display device in a fifth embodiment.

FIG. 9 is a diagram depicting a sectional configuration of a display device 500 in the fifth embodiment. As depicted in FIG. 9, in the present embodiment, an insulating layer 901 is provided on the back surface of the counter substrate 107 at the curved part 112. As the insulating layer 901, a resin layer can be used, although not limited thereto.

In the present embodiment, the insulating layer 901 serves a function of protecting the wiring and so forth positioned at the curved part 112 and also controlling a neutral surface when the liquid-crystal cell 110 is bent. For example, when the thickness of the array substrate 101 and the thickness of the counter substrate 107 are different from each other, the neutral surface may be shifted from the wiring and so forth positioned at the curved part 112 at the time of bending. In this case, the neutral surface is aligned with the wiring and so forth positioned at the curved part 112 by using the insulating layer 901, thereby allowing the risk of a break of the wiring to be reduced.

Sixth Embodiment

In the display device 100 of the first embodiment, the example is described in which bending is performed along one side of the display section 102. In a sixth embodiment, an example is described in which the display device is bent along two different sides of the display section. Description is made by focusing on a difference in configuration from the display device 100 of the first embodiment, and the same structure is provided with the same reference character and may not be described.

Figure 10:
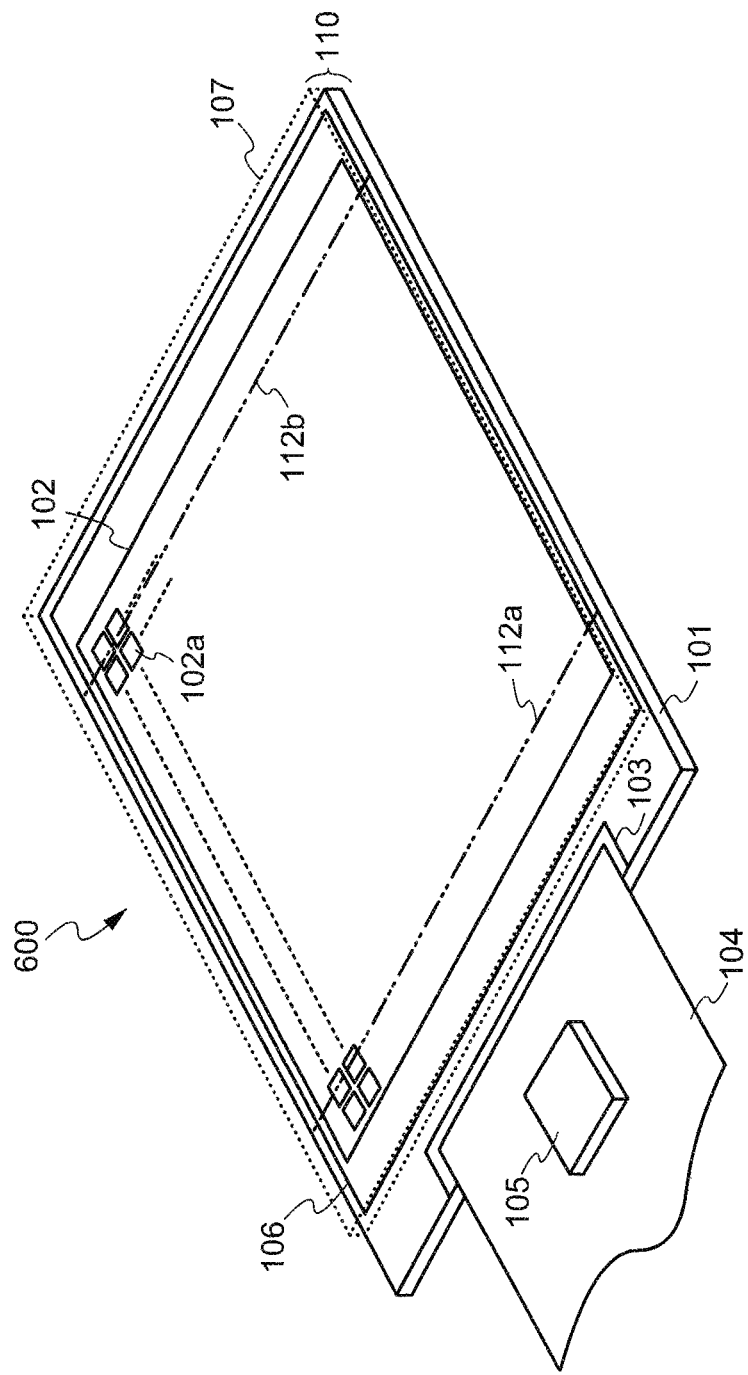
FIG. 10 is a perspective view depicting an example of a schematic configuration of a display device in a sixth embodiment.

FIG. 10 is a perspective view depicting a schematic configuration of a display device 600 in the sixth embodiment. In the display device 600 of the present embodiment, the configuration is such that the liquid-crystal cell 110 is bent not only along the two-dot-chain line 112a but also along a two-dot-chain line 112b. Also in this case, the two-dot-chain line 112b is inside the sealant 106 (specifically, inside the display section 102), and the curved part formed outside the two-dot-chain line 112b is thus formed inside the sealant 106.

In the display device 600 depicted in FIG. 10, no bezel portion is present on two sides of the displayable region. Thus, it is possible to provide a thin display device with a further less bezel portion than the display device 100 of the first embodiment.

Figure 11A:
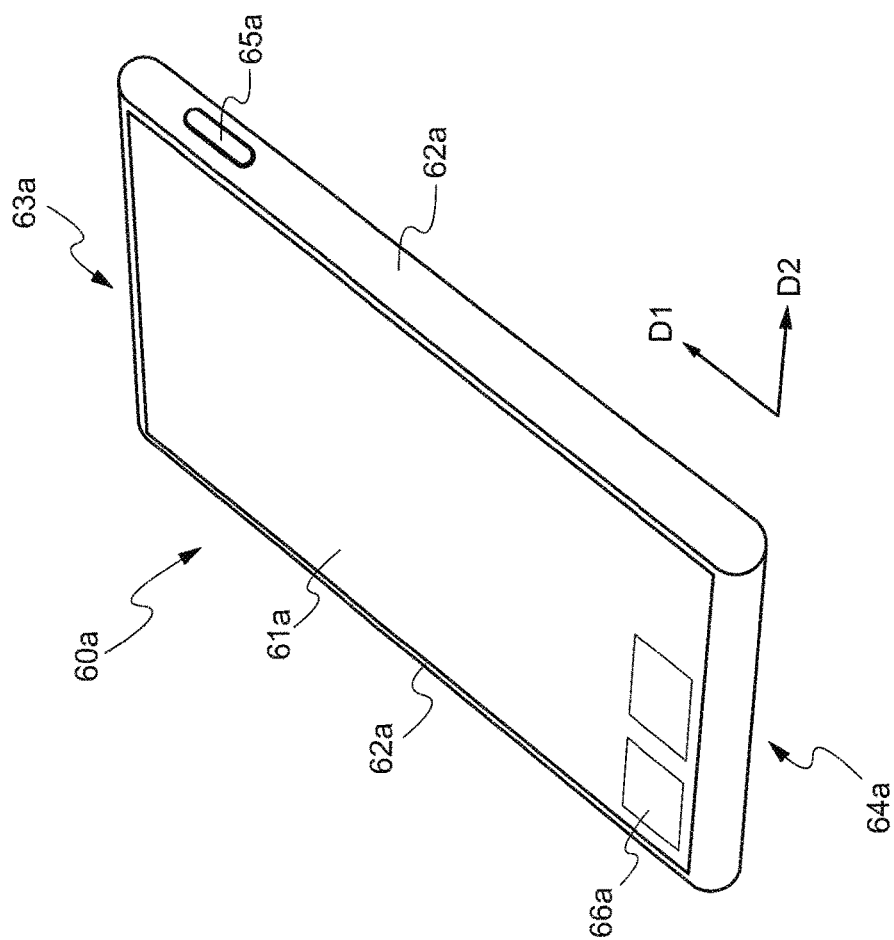
FIG. 11A is a perspective view depicting an example of a schematic configuration of an electronic device having the display device of the sixth embodiment incorporated therein.

FIG. 11A and FIG. 11B are perspective views depicting examples of electronic devices 60a and 60b, respectively, having incorporated therein the display device 600 of the present embodiment. Specifically, as the electronic devices 60a and 60b, portable telephones (smartphones) are illustrated. However, the electronic devices 60a and 60b are not limited to portable telephones but can be applied to any information terminal having a display screen, such as a tablet PC.

As depicted in FIG. 10, the display device 600 of the present embodiment is bent to the back surface side along the two-dot-chain line 112a and the two-dot-chain line 112b, as depicted in FIG. 10. That is, the terminal unit 103 and the flexible printed circuit board 104 as a non-displayable region are arranged on the back surface side of the array substrate 101. Therefore, when the electronic device 60a and the electronic device 60b are viewed in a planar view, frame units 62a and 62b are both configured to be narrow (a narrow frame structure).

Here, the electronic device 60a depicted in FIG. 11A includes a display screen 61a and the frame unit 62a. The display screen 61a is a screen for displaying video by using the display section 102 depicted in FIG. 10. While the display screen 61a is flat in the present embodiment, the display screen 61a may be bowed. The frame unit 62a functions as a housing of the electronic device 60a. The frame unit 62a is also called a bezel.

In the electronic device 60a, the frame unit 62a is arranged on all of the four sides. As described above, the display device 600 is folded along the two-dot-chain lines 112a and 112b, and thus the frame unit 62a arranged at ends 63a and 64a of the electronic device 60a in a D1 direction can be narrowed. While the frame unit 62a arranged at the ends 63a and 64b has bowed surfaces in FIG. 11A, the frame unit 62a may be configured of flat surfaces. Also, the frame unit 62a may be provided with an input unit 65a configured of hardware such as a power supply button. On the display screen 61a, an object 66a configuring a user interface such as an icon can be displayed.

As with the electronic device 60a, the electronic device 60b depicted in FIG. 11B includes a display screen 61b and the frame unit 62b. Most of the display screen 61b is flat, but may be bowed as a whole. Unlike the electronic device 60a, the frame part 62b is not arranged at ends 63b and 64b in the electronic device 60b, and the ends 63b and 64b are bowed. Thus, the frame unit 62b is not visually recognized by the observer at the ends 63b and 64b in the D1 direction in a planar view. That is, the display screen 61b extends to a virtual end (an end visually recognizable by the observer in a planar view) in the D1 direction.

The frame unit 62b may be provided with an input unit 65b configured of hardware such as a power supply button. Also in the electronic device 60b, the display screen 61b is bowed at the ends 63b ad 64b, and an object 66b configuring a user interface such as an icon can be displayed also at that bowed portion.

As described above, in the electronic devices 60a and 60b, by bending two sides of the display section 102 of the display device 600 facing each other, the frame unit 62a arranged at the ends 63a and 64a can be narrowed as in FIG. 11A, and the ends 63b and 64b can be effectively utilized as the display screen 61b as in FIG. 11B.

Furthermore, in the electronic device 60a (or 60b) of the present embodiment, a wiring layout is considered so that a portion of the frame unit 62a (or 62b) positioned on the same plane as the display screen 61a (or 61b) can be narrowed as much as possible. This can allow the display section 102 depicted in FIG. 10 to be fully and effectively utilized in both of the D1 and D2 directions as a display screen of the electronic device 60a (or 60b).

Figure 12:
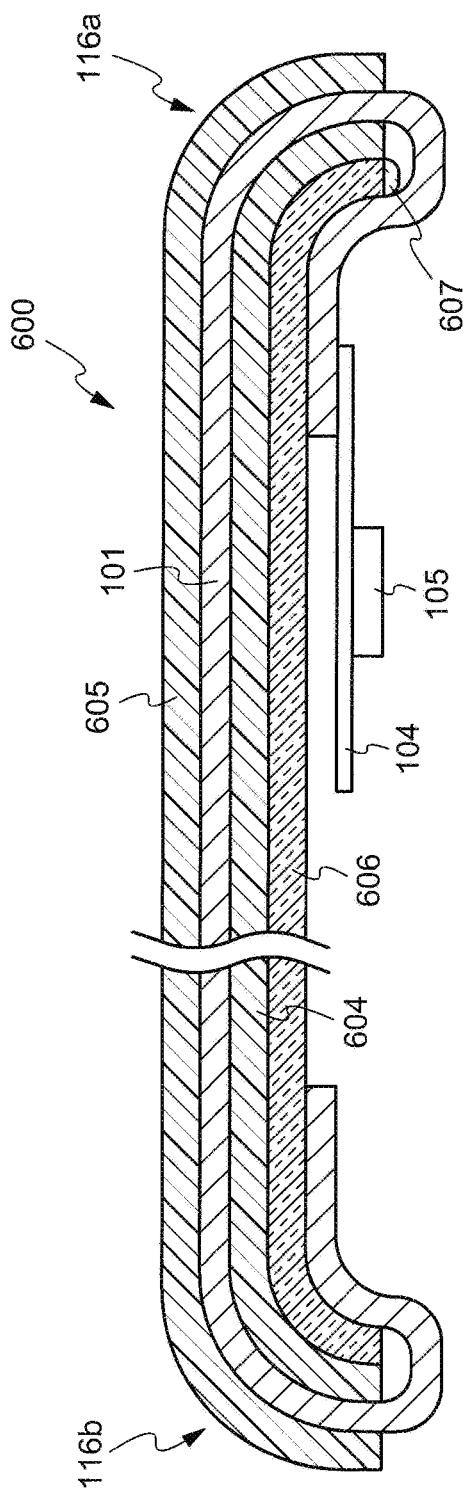
FIG. 12 is a sectional view depicting the example of the schematic configuration of the display device in the sixth embodiment.

FIG. 12 depicts an example of a sectional view of the display device 600 when the electronic device 60b depicted in FIG. 11B is cut along a D1 direction. As depicted in FIG. 12, in the display device 600, flexible polarizing members 604 and 605 are arranged so as to interpose the liquid-crystal cell 110. Also, on the back surface side of the flexible polarizing member 604, a light-guiding member with flexibility (hereinafter referred to as a "flexible light-guiding member") 606 is arranged. At an end of the flexible light-guiding member 606, a light source 607 is arranged.

In the present embodiment, a polarizing member with a thickness reduced to the extent of having flexibility is used as the flexible polarizing members 604 and 605. For example, by using a polarizing member with a thickness on the order of 30 μm to 70 μm, the flexible polarizing members 604 and 605 can be extended to the curved parts 116a and 116b. Furthermore, by using, for example, a light-guiding member with a thickness equal to or smaller than 600 μm (preferable equal to or smaller than 450 μm and, more preferably, equal to or larger than 50 μm and equal to or smaller than 350 μm) as the flexible light-guiding member 606, the flexible light-guiding member 606 can be extended to the curved parts 116a and 116b. As a matter of course, the flexible polarizing members 604 and 605 can be replaced by coating-type polarizing members.

As described above, in the display device 600 of the present embodiment, the polarizing member and the light-guiding member are arranged also at the curved parts 116a and 116b. This allows the curved parts 116a and 116b to be used as part of the display section 102.

While the example is described in the electronic device 60b of the present embodiment in which the liquid-crystal cell 110 is bent along two sides of the display section 102 and the ends 63b and 64b of the display screen 61b in the D1 direction are bowed. However, the present embodiment is not limited to this. For example, two sides can be bowed not only in the D1 direction but also in the D2 direction to make a display screen with ends of all of four sides being bowed. In this case, in a planar view, a display device without a frame portion can be achieved.

Seventh Embodiment

In a seventh embodiment, an example is described in which the display device is bent along two sides different from those of the sixth embodiment. Description is made by focusing on a difference in configuration from the electronic devices 60a and 60b and the display device 600 of the sixth embodiment, and the same structure is provided with the same reference character and may not be described.

Figure 13:
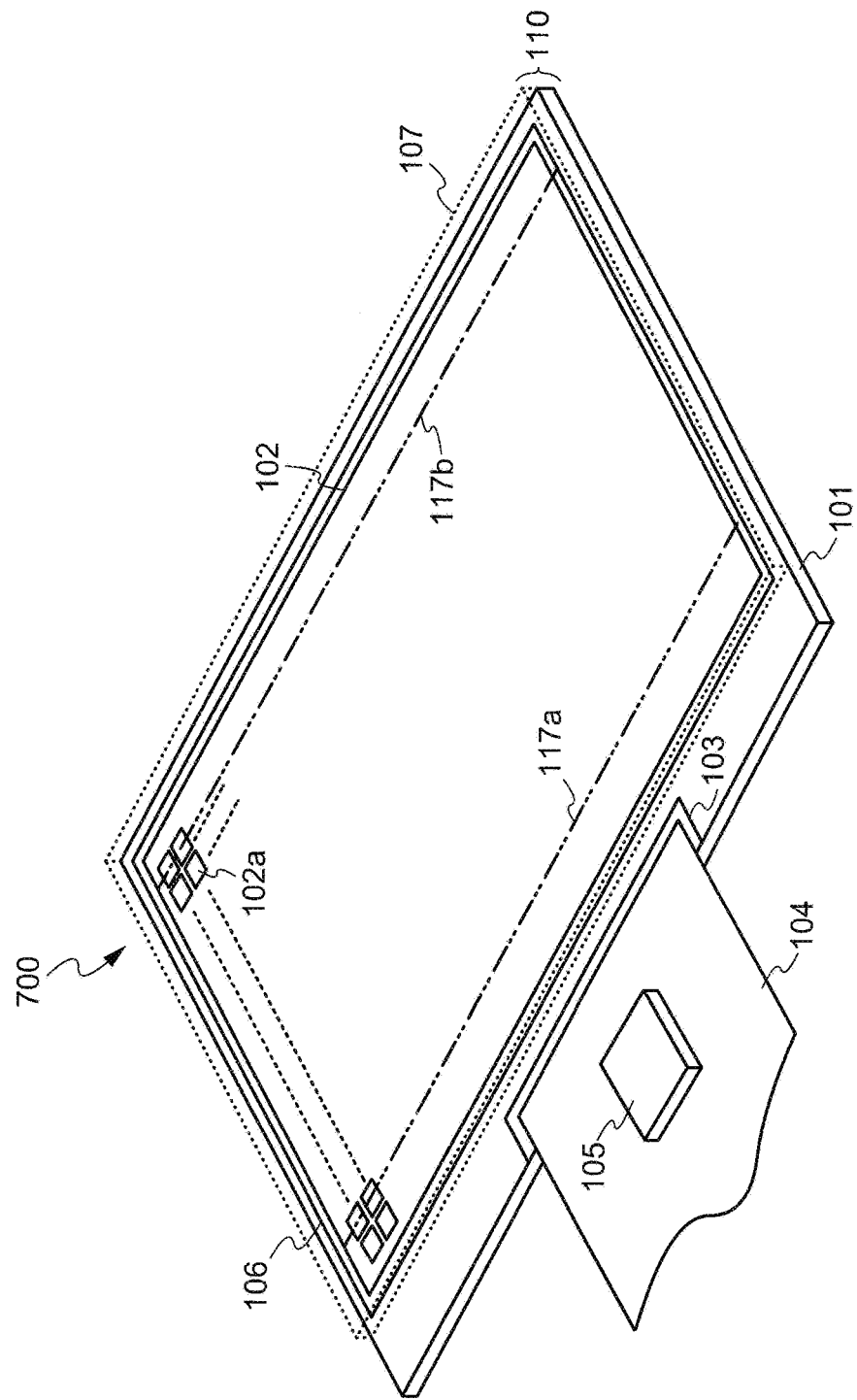
FIG. 13 is a perspective view depicting an example of a schematic configuration of a display device in a seventh embodiment.

FIG. 13 is perspective view depicting a schematic configuration of a display device 700 in the seventh embodiment. In the sixth embodiment depicted in FIG. 10, the terminal unit 103 is provided on a short side of the display device 600 and bending is performed along the short side. By contrast, in the present embodiment depicted in FIG. 13, the terminal unit 103 is provided on a long side of the display device 700 and bending is performed along the long side. That is, the display device 700 of the present embodiment is configured to be bent along two-dot-chain lines 117a and 117b along the long sides of the liquid-crystal cell 110.

As with the sixth embodiment, the two-dot-chain lines 117a and 117b are inside the sealant 106 (specifically, inside the display section 102). Thus, the curved part corresponding to a bent portion is formed inside the sealant 106.

Figure 14:
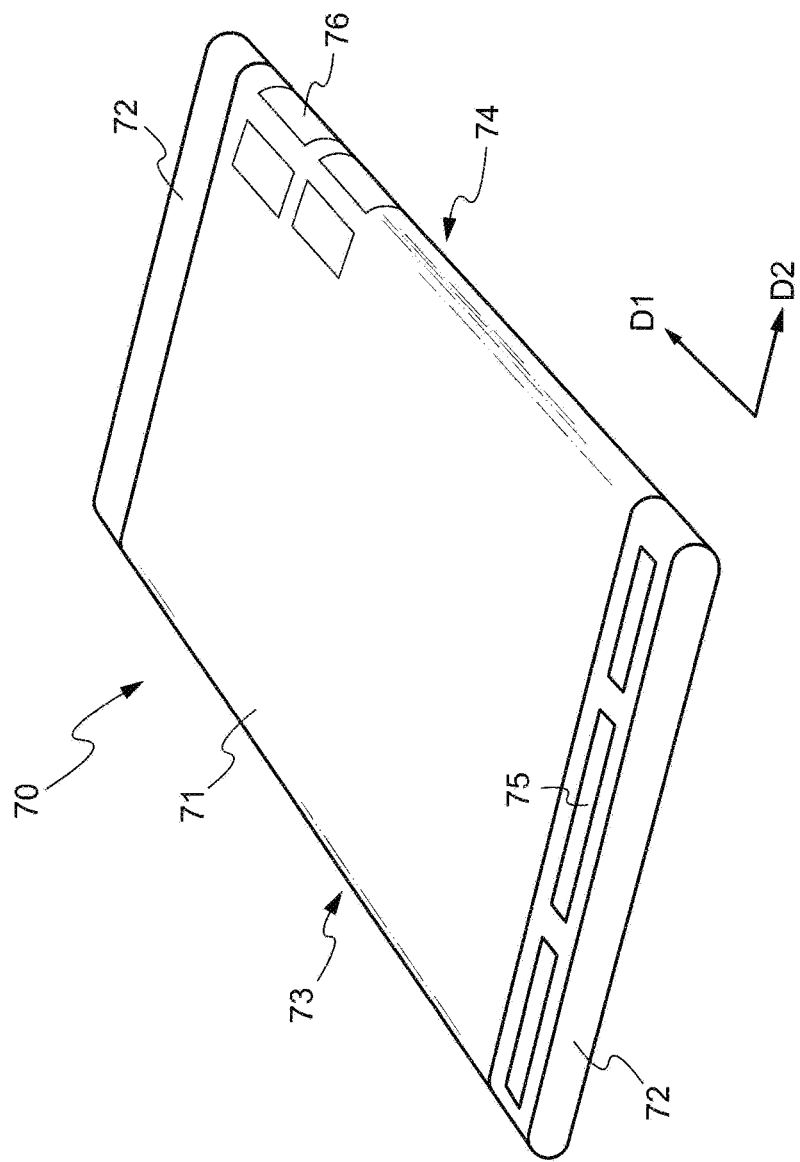
FIG. 14 is a perspective view depicting an example of a schematic configuration of an electronic device having the display device of the seventh embodiment incorporated therein.

FIG. 14 is a perspective view depicting an example of the electronic device 70 having the display device 700 of the present embodiment incorporated therein. Specifically, a portable telephone (smartphone) is illustrated as the electronic device 70. However, the electronic device 70 is not limited to a portable telephone but can be applied to any information terminal having a display screen, such as a tablet PC.

As with the electronic device 60b depicted in FIG. 11B, the electronic device 70 includes a display screen 71, a frame unit 72, and bowed ends 73 and 74. In the present embodiment, when viewed in a planar view, the ends 73 and 74 of the display screen 71 in the D2 direction are bowed. The frame unit 72 is provided with an input unit 75 configured of hardware such as a power supply button. Also, at the ends 73 and 74, an object 76 configuring a user interface such as an icon can be displayed.

Also in the display device 700 of the present embodiment, as with the sixth embodiment, a flexible polarizing member and a flexible light-guiding member are used. That is, a flexible polarizing member and a flexible light-guiding member can be arranged also at a curved part outside the two-dot-chain lines 117a and 117b, and the ends 73 and 74 of the display screen 71 can thus be used as part of the display screen 71. In particular, in the present embodiment, the configuration is such that the long sides of the display device 700 are bowed. Thus, the object 76 can be displayed at a position naturally touched by a finger when the observer holds the display device 700 by hand.

In the present embodiment, the example is described in which the liquid-crystal cell 110 is bent along two sides of the display section 102 to bow the ends 73 and 74 of the display screen 71 in the D2 direction. However, the present embodiment is not limited to this. For example, two sides can be bowed not only in the D2 direction but also in the D1 direction to make a display screen with ends of all of four sides being bowed. In this case, in a planar view, a display device without a frame portion can be achieved.

Eighth Embodiment

In an eighth embodiment, an example is described in which the entire display screen 71 of the electronic device 70 in the seventh embodiment is bowed. Description is made by focusing on a difference in configuration from the electronic device 70 and the display device 700 of the seventh embodiment, and the same structure is provided with the same reference character and may not be described.

Figure 15:
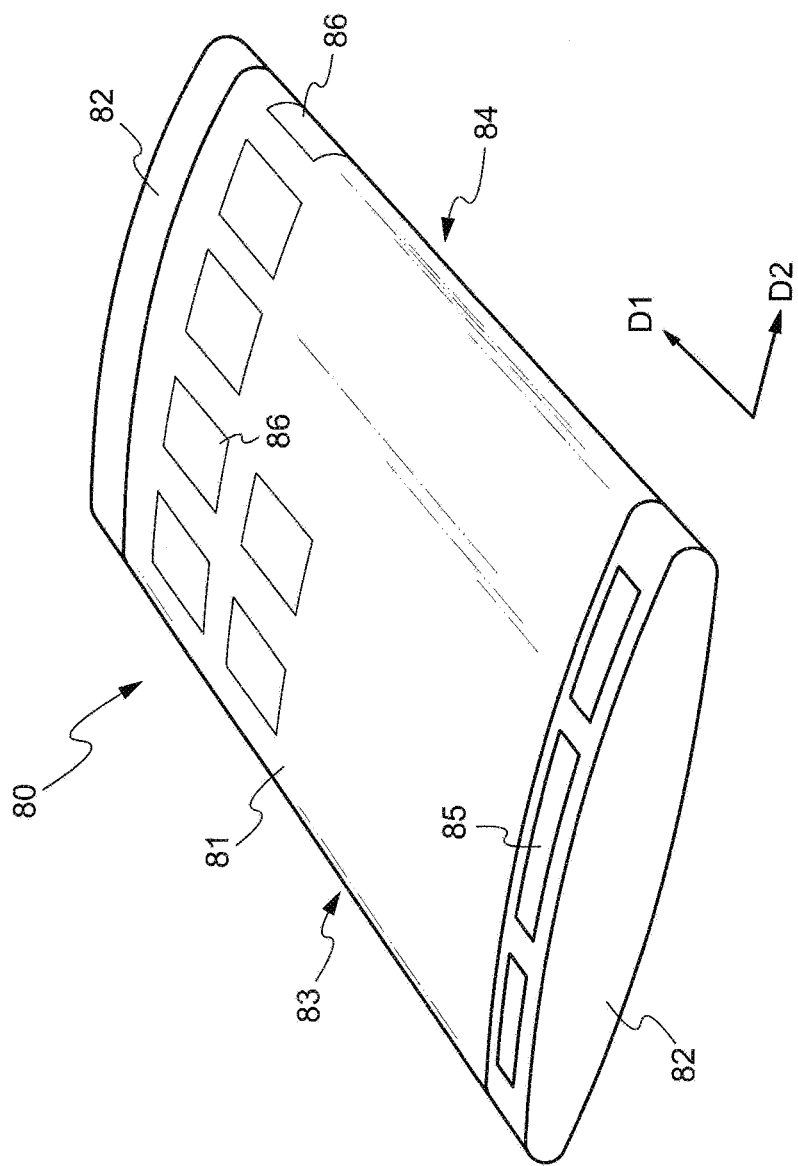
FIG. 15 is a perspective view depicting an example of a schematic configuration of an electronic device having a display device of an eighth embodiment incorporated therein.

FIG. 15 is a perspective view depicting an example of an electronic device 80 having a display device 800 of the eighth embodiment incorporated therein. While a portable telephone (smartphone) is illustrated as the electronic device 80 also in the present embodiment, the present embodiment is not limited to this.

As with the electronic device 70 depicted in FIG. 14, the electronic device 80 includes a display screen 81, a frame unit 82, and bowed ends 83 and 84. In the present embodiment, the entire display screen 81 is mildly bowed in the D2 direction, and the ends 83 and 84 are bowed at a radius of curvature smaller than that near the center of the display screen 81. Thus, the electronic device 80 is in an elliptic columnar shape.

Also in the present embodiment, as with the seventh embodiment, the frame unit 82 is provided with an input unit 85 configured of hardware such as a power supply button. Also on the display screen 81 (including the ends 83 and 84), an object 86 configuring a user interface such as an icon can be displayed.

Figure 16:
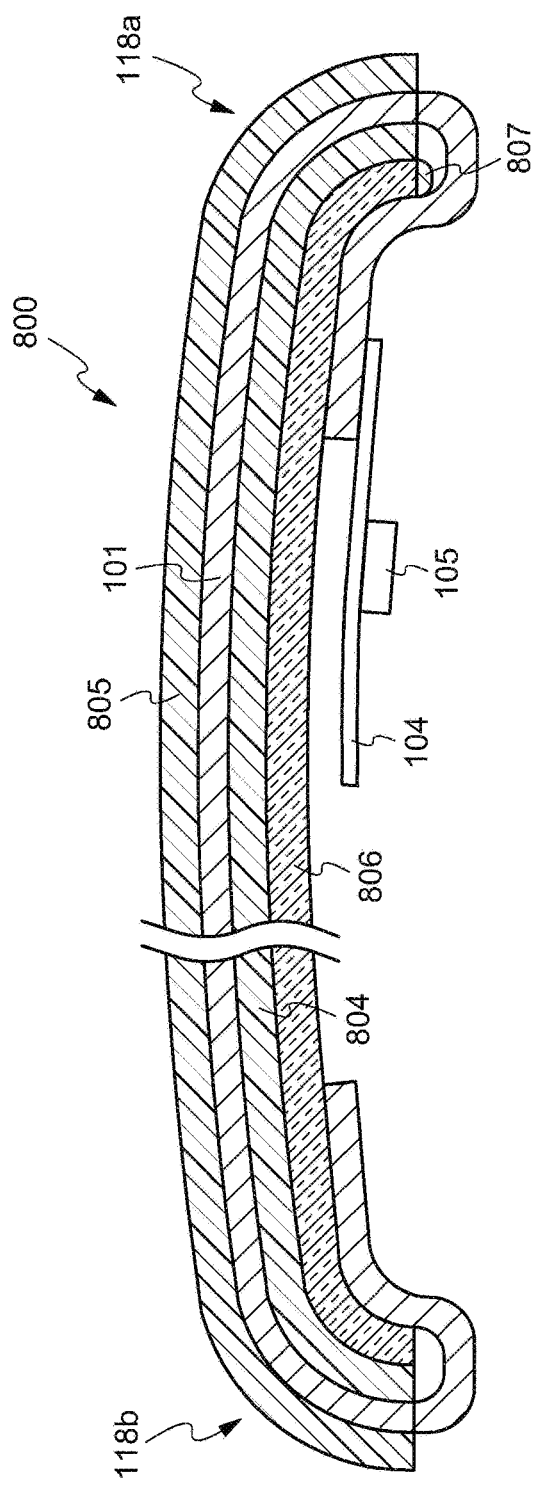
FIG. 16 is a sectional view depicting an example of a schematic configuration of the display device in the eighth embodiment.

FIG. 16 depicts an example of a sectional view of the display device 800 when the electronic device 80 of the present embodiment is cut along a D2 direction. As depicted in FIG. 16, in the display device 800, flexible polarizing members 804 and 805 are arranged so as to interpose the liquid-crystal cell 110. Also, a flexible light-guiding member 806 is arranged on a back surface side of the flexible polarizing member 804. At an end of the flexible light-guiding member 806, a light source 807 is arranged.

In the present embodiment, as the flexible polarizing members 804 and 805, a polarizing member with a thickness reduced to the extent of having flexibility is used. As depicted in FIG. 16, the flexible polarizing members 804 and 805 are each mildly bowed at a portion near the center to bow curved parts 118a and 118b at a radius of curvature smaller than that near the center. Also, the flexible light-guiding member 806 is bowed to have a shape similar to those of the flexible polarizing members 804 and 805.

As described above, in the display device 800 of the present embodiment, not only the curved parts 118a and 118b but also the polarizing members and the light-guiding members arranged near the center of the display section 102 are bowed. Thus, more stereoscopic video display can be provided to the observer.

In the present embodiment, the example is described in which the ends 83 and 84 of the display screen 81 in the D2 direction are bowed. However, the present embodiment is not limited to this. For example, two sides can be bowed not only in the D2 direction but also in the D1 direction to make a display screen with a portion near the center and ends of all of four sides being bowed. In this case, in a planar view, a display device without a frame portion can be achieved.

In each of the embodiments described above, description is made to a display device by way of example. However, a display apparatus having the display device in each embodiment incorporated therein can be included in the scope of the present invention. Here, the display apparatus refers to a general apparatus using the display device as a display medium such as a portable information terminal.

The embodiments described above as embodiments of the present invention can be implemented as being combined as appropriate as long as combinations are not contradictory to one another. Also, addition, deletion, or design change of a component or addition, omission, or change in condition of a step made as appropriate by a person skilled in the art based on the display device of each embodiment is included in the scope of the present invention as long as they have the gist of the present invention.

Even operations and effects that are different from those brought by the modes of each of the above-described embodiments but are evident from the description of the specification or can be easily predicted by a person skilled in the art are construed as those naturally brought by the present invention.

What is claimed is:

1. A display device comprising:
a first substrate with flexibility, the first substrate having a display section including a first pixel;
a second substrate with flexibility;
a sealant which bonds the first substrate and the second substrate together; and
an illuminating device provided on a back surface side of the first substrate and including a light-guiding member and a light source,
wherein
the first substrate and the second substrate have a curved part so that the sealant and the display section overlap each other in a planar view, and
the light-guiding member is arranged between the display section and the sealant in a sectional view.

2. The display device according to claim 1, further comprising a color filter member, wherein
the color filter member overlaps the display section and the curved part.

3. The display device according to claim 1, wherein
the light-guiding member is interposed between the back surface inside the curved part and the back surface outside the curved part, and
the light source opposes the curved part.

4. The display device according to claim 1, wherein
the first pixel has a thin-film transistor and a pixel electrode to which a video signal is supplied via the thin-film transistor, and
the first pixel is not arranged in a part of the curved part or in a part inside the sealant part and outside the curved part.

5. The display device according to claim 1, wherein
a resin layer is provided on the back surface of the first substrate outside the curved part.

* * * * *